United States Patent [19]

Morris

[11] Patent Number: 4,687,880
[45] Date of Patent: Aug. 18, 1987

[54] TUBULAR LUMINESCENCE PHOTOVOLTAIC ARRAY

[75] Inventor: Robert K. Morris, Colorado Springs, Colo.

[73] Assignee: The United States of America as represented by the Secretary of the Air Force, Washington, D.C.

[21] Appl. No.: 926,061

[22] Filed: Nov. 3, 1986

[51] Int. Cl.⁴ .................. H02N 6/00; H01L 25/02
[52] U.S. Cl. .................................................. 136/246
[58] Field of Search .............................. 136/246, 259

[56] References Cited

U.S. PATENT DOCUMENTS

| | | | |
|---|---|---|---|
| Re. 30,584 | 4/1981 | Russell | 136/246 |
| 247,229 | 9/1981 | Wheeler | 362/32 |
| 2,506,625 | 5/1950 | Woolley | 136/246 |
| 3,565,719 | 2/1971 | Webb | 156/212 |
| 3,976,508 | 8/1976 | Mlavsky | 136/246 |
| 3,990,914 | 11/1976 | Weinstein et al. | 136/246 |
| 4,026,267 | 5/1977 | Coleman | 126/436 |
| 4,304,955 | 12/1981 | Meckler | 136/259 |
| 4,519,384 | 5/1985 | Murtha | 126/438 |
| 4,529,830 | 7/1985 | Daniel | 136/246 |

OTHER PUBLICATIONS

"Crosscurrents", Science 86, 4, 72 (Apr. 1986).

Primary Examiner—Aaron Weisstuch
Attorney, Agent, or Firm—Bobby D. Scearce; Donald J. Singer

[57] ABSTRACT

A photovoltaic solar cell system is provided which comprises a hollow light tube of substantially conventional design of optically transparent material, generally square cross section and preselected length and width and having on the outer surfaces thereof longitudinally extending triangularly shaped grooves defining a plurality of ridges having triangular cross section along the tube length, each ridge having a 90° apex angle and surfaces along its length defining a 45° angle with the inner surfaces of the tube; light concentrating optics are operatively connected to one end of the tube for directing light into the tube; and a plurality of solar cells are disposed on the outer surfaces of the tube in a rectangular array of size corresponding to tube size with the photoactive surfaces of the cells facing inwardly of the tube. The tube may be hermetically sealed and either evacuated or filled with inert gas in certain applications.

11 Claims, 9 Drawing Figures

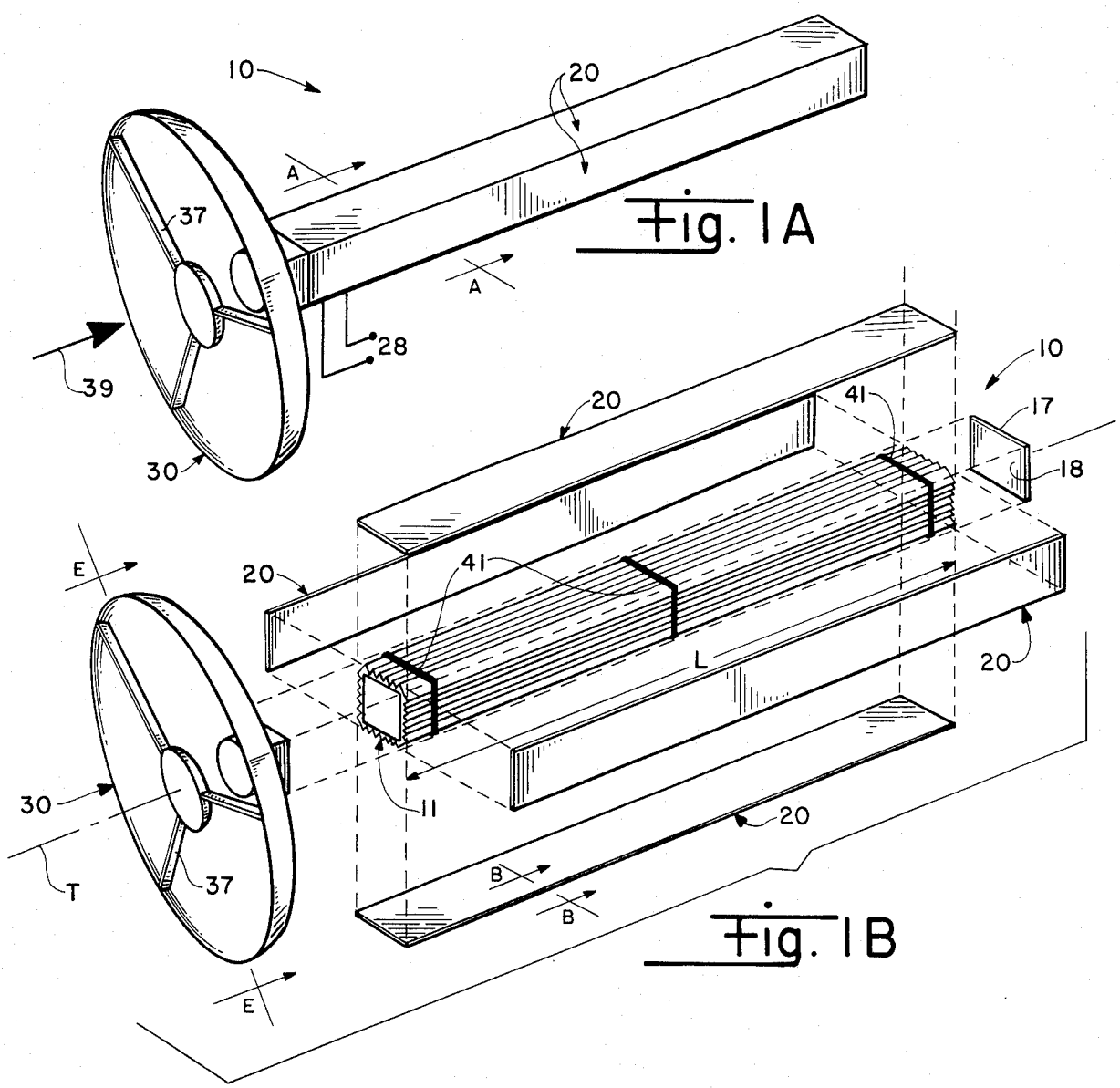
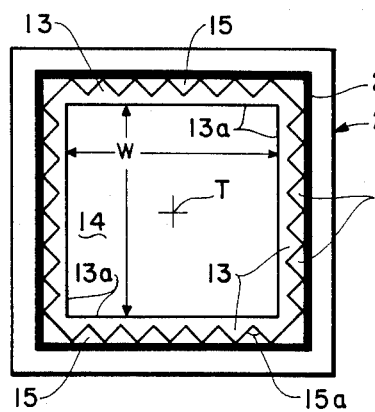
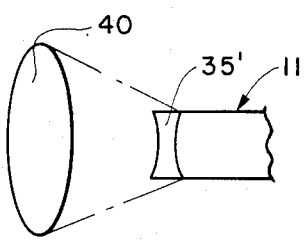
Fig. 1A
Fig. 1B
Fig. 1C
Fig. 4

TUBULAR LUMINESCENCE PHOTOVOLTAIC ARRAY

RIGHTS OF THE GOVERNMENT

The invention described herein may be manufactured and used by or for the Government of the United States for all governmental purposes without the payment of any royalty.

BACKGROUND OF THE INVENTION

The present invention relates generally to photovoltaic systems for converting sunlight to electrical power, and more particularly to a novel system for directing light onto enclosed photovoltaic arrays for electrical power generation in remote applications.

Existing solar photovoltaic array structures are substantially limited to planar (flat) arrays of large size to provide sufficiently high power for remote power applications such as aboard orbiting spacecraft. Since storage capacities of launch vehicles for space applications are severely limited, flexible planar arrays were developed consisting of photocells on flexible substrates which may be stored in rolled or folded condition and selectively deployed after orbit insertion. The flexible arrays suffer from distinct shortcomings in that large structures are required for high power systems, and inherent dynamic instability exists in the deployed array because of the light weight of materials used as substrates combined with substantial extension of the array for operation. Deployment mechanisms for flexible arrays can be complicated, expensive, and heavy. The large area subtended by the deployed flexible array subjects the constituent solar cells to substantial meteoroid and particulate radiation impingement hazard which necessitates use of protective coverglasses for the cells. The exposed surfaces also limit operating voltages due to space plasma interactions. Photovoltaic arrays having optics which concentrate sunlight onto individual cells provide some protection from impact, but present a weight penalty and require multiple complex and expensive optical collectors.

The present invention solves or substantially reduces in critical importance the aforementioned shortcomings in existing photovoltaic systems by providing a photovoltaic power system particularly applicable for use in providing electrical power to systems of orbiting spacecraft or other remote environments. A conventional hollow prismatic light tube of square cross section, smooth inner surfaces, and grooved outer surface is provided with a plurality of photovoltaic cells mounted in four rectangular arrays on thin substrates attached to the grooved surfaces with the cells inwardly facing of the light tube. Light concentrating optics are disposed at the light receiving end of the light tube to illuminate the tube and cells with maximum intensity, and may be configured to concentrate into the light tube sufficient light for each cell in the arrays equivalent in intensity to that of the surrounding environment.

The invention has substantial utility for powering spacecraft systems requiring high power in remote locations. The system of the invention may be configured in modular form, is lightweight, and is minimally vulnerable to damage by particulate impact, and consequently has maximum mission lifetime.

It is, therefore, a principal object of the invention to provide an improved photovoltaic system for conversion of sunlight to electrical power.

It is a further object of the invention to provide a modular photovoltaic system for remote mission applications.

It is a further object of the invention to provide a compact photovoltaic system for applications aboard orbiting spacecraft.

It is yet another object of the invention to provide a photovoltaic system which is protected against radiation damage and particle impact.

These and other objects of the invention will become apparent as the detailed description of representative embodiments proceeds.

SUMMARY OF THE INVENTION

In accordance with the foregoing principles and objects of the invention, a photovoltaic solar cell system is provided which comprises a hollow light tube of substantially cnventional design of optically transparent material, generally square cross section and preselected length and width and having on the outer surfaces thereof longitudinally extending triangularly shaped grooves defining a plurality of ridges having triangular cross section along the tube length, each ridge having a 90° apex angle and surfaces along its length defining a 45° angle with the inner surfaces of the tube; light concentrating optics are operatively connected to one end of the tube for directing light into the tube; and a plurality of solar cells are disposed on the outer surfaces of the tube in a rectangular array of size corresponding to tube size, with the photoactive surfaces of the cells facing inwardly of the tube. The tube may be hermetically sealed and either evacuated or filled with inert gas in certain applications.

DESCRIPTION OF THE DRAWINGS

The invention will be more clearly understood from the following detailed description of representative embodiments thereof read in conjunction with the accompanying drawings wherein:

FIG. 1A is a schematic perspective view of a representative tubular luminescence photovoltaic array system of the invention;

FIG. 1B is an exploded perspective view of the system of FIG 1A;

FIG. 1C is a sectional view along line A—A of FIG. 1A;

FIG. 2A is a sectional view along line B—B of FIG. 1B;

FIG. 4 shows alternative optics for the system of FIG. 1A.

DETAILED DESCRIPTION

Figure 2B:
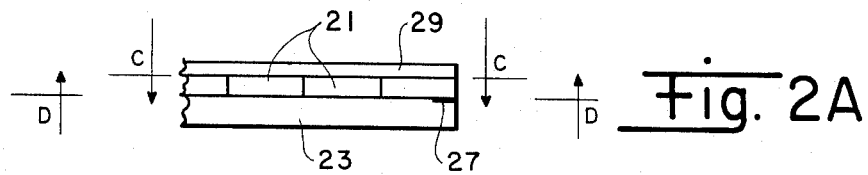
FIG. 2B is a view along line C—C of FIG. 2A.
Figure 2B:
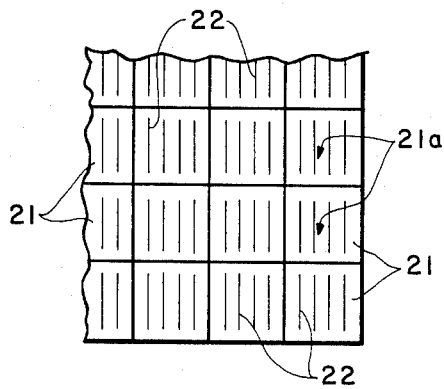

Referring now to the drawings, FIG. 1A is a schematic view in perspective of the tubular luminescence photovoltaic array system 10 of the invention, which illustrates the modular characteristic of the invention. FIG. 1B is an exploded view in perspective of system 10. FIGS. 1A, 1B illustrate the assembly of three major cooperating constituent assemblies of system 10. Light tube 11 is closed at one end and has a plurality of rectangular photovoltaic cell arrays 20 disposed on the surfaces of tube 11 along the lengthwise faces thereof; light concentrating optics 30 are operatively attached to the light receiving end of light tube 11 substantially as shown in FIGS. 1A, 1B.

Reference is now made to FIG. 1B in conjunction with FIG. 1C, a view along line A—A of FIG. 1A. Light tube 11 by itself is a substantially conventional device which converts a beam of light directed thereinto along central axis T into a radial glow, which results in the transport of light of substantially uniform intensity along length L thereof. Light tube 11 has a generally square cross section as shown in FIG. 1C and comprises four substantially identical walls 13 having smooth internal surfaces 13a defining elongated chamber 14 of square cross section. A plurality of triangular grooves defining prismatic ridges 15 of triangular cross section are formed on the outer surfaces of walls 13 and extend along the lengths thereof. Each prismatic ridge 15 defines an epex angle 15a equal to 90° and the surfaces of each ridge form an angle of 45° angle with inner surfaces 13a of light tube 11. Light tube 11 may be fabricated to substantially any desired length L and width w, may be obtained commercially, and comprises any suitable optically transparent material such as acrylic, glass, or the like. Mirror 17 having an inwardly facing reflective surface 18 thereon may be disposed at the closed end of light tube 11 opposite optics 30 as suggested in FIG. 1B, for back reflection of stray light within light tube 11.

Figure 2C:
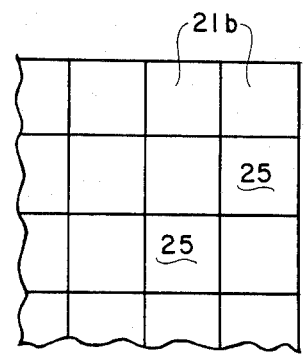
FIG. 2C is a view along line D—D of FIG. 2A.

As illustrated in FIGS. 1B, 1C, a solar cell array assembly 20 of size and rectangular shape corresponding to that of light tube 11 is disposed on each lengthwise outer surface of light tube 11. Referring additionally to FIGS. 2A, B, C, shown in FIG. 2A is a sectional view along line B—B of FIG. 1B. FIG. 2B is a view along line C—C of FIG. 2A, and FIG. 2C is a view along line D—D of FIG 2A. As shown in FIG. 2A, each solar cell array assembly 20 comprises a plurality of solar cells 21 of any convenient preselected size (usually about 2×2, 2×4, or 4×4 cm) and of any conventional type, i.e., silicon, gallium arsenide, indium phosphide, amorphous silicon, or other, and of cascade or multijunction type as would occur to the skilled artisan guided by these teachings, the same not being limiting of the invention herein, Cells 21 are supported on substrate 23 of Kapton ™, Kevlar ™, Kel-F ™, or the like, to provide structural support and protection to cells 21 within system 10 (FIG. 1A). The back surfaces 21b of cells 21 are attached in suitable fashion to substrate 23, the active surfaces 21a facing inwardly of light tube 11 as suggested in FIG 1B. Back surfaces 21b may conventionally include electrical contacts 25, and substrate 23 may include current collecting buses 27 for connection to output 28 (FIG. 1A). Active surfaces 21a include the photovoltaic junctions 22 of cells 21. A transparent protective covering 29 of silicon dioxide, aluminum oxide, or the like may be dispersed in the array structure to cushion active surfaces 21a against prismatic ridges 15 on light tube 11. Alternatively, cushioned straps 41 may be spaced along light tube 11 (FIG. 1B) to protect the front surfaces of cells 21.

Figure 3A:
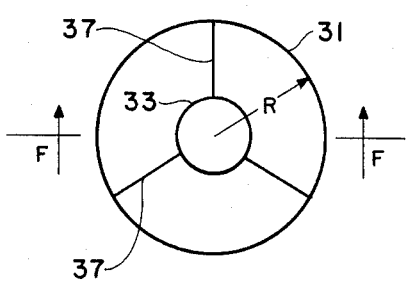
FIG. 3A is a view along line E—E of FIG. 1B.
Figure 3B:
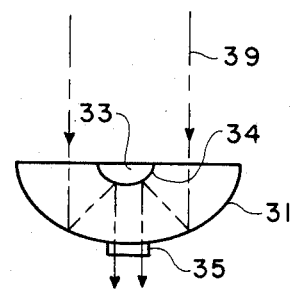
FIG. 3B is a view along line F—F of FIG. 3A.

Referring now to FIGS. 3A, 3B in conjunction with FIG. 1B, shown in FIG. 3A is an end view of optics 30 along line E—E of FIG. 1B. FIG. 3B is a sectional view of FIG. 3A along line F—F. Optics 30 may comprise any suitable lens or other light collecting system for concentrating light into light tube 11 for illumination of solar cell arrays 20 in generating electricity using the invention. The representative optics 30 shown in FIGS. 1B, 3A, 3B include a parabolic reflector 31 or equivalent concave dish reflector for collecting and focusing light beam 39 toward a central focusing reflector 33 having a reflective surface 34 for concentrating light 39 into a transition element at the light receiving end of light tube 11 in the form of collimating lens 35 which substantially collimates light 39 along axis T within light tube 11. Reflector 33 may be supported at the focus of reflector 31 by a plurality of thin webs 37 as required. As light 39 transits light tube 11, prismatic ridges 15 allow light to be radiated outwardly onto arrays 20 while back reflecting the light down light tube 11 until light 39 transits length L and is back reflected by reflective surface 18 for further illumination of arrays 20.

Referring now to FIG. 4, shown therein is an alternative arrangement for the light concentrating optics of system 10 wherein a suitably sized lens system 40 is optically coupled to collimating lens 35' for concentrating light into light tube 11.

System 10 of the invention as just described may be fabricated to substantially any size, although ordinarily a modular unit of practical size will comprise a light tube of about 30 to 60 cm in width and about 15 m long, which will produce about 1 to 2.5 kW at about 200 volts (depending on wiring configuration) under usual illumination conditions in earth orbit. A plurality of modular units may be assembled to produce a desired output. In the selection of optics 30 (or 40) for inclusion in system 10 of the invention, sufficient light should be collected for adequate illumination of arrays 20 of area 4Lw (FIGS. 1b, 1c). Accordingly, the optics should be sized to have a radius R to collect light from an area $\pi R^2$ equal to or greater than 4Lw so that arrays 20 receive an amount of light equivalent in intensity to that of the surrounding environment. This, however, is not a structural or operational limitation within the contemplation of the invention or the scope of the claims, as the invention will function at lower light intensities. For operation of system 10 in orbit, optics 30 may be configured to be remotely deployable. Remotely operable aiming means (not shown) may be operatively connected to system 10 and used to direct optics 30 toward the sun for optimum collection of light 39 intensity.

In the assembly of optics 30, light tube 11, arrays 20, and mirror 17 it may be desirable to hermetically seal system 10 and to enclose an inert gas within light tube 11 and in the voids defined between prismatic ridges 15 and covering 29 to protect cells 21 and other component parts from corrosion. Alternatively, light tube 11 and the voids may be evacuated. To the outer surfaces of assembled system 10 (FIG. 1A) may be added a suitable covering (not shown) for further protection against radiation or meteroid impact.

The photovoltaic system of the invention may be configured as a single unit or assembled in modular form of a plurality of such units to provide desirably high current output. The photovoltaic cells of the system are enclosed and substantially protected from particle impact and radiation hazards, which extends cell and array lifetime and improves overall array performance. the compactness of each modular system allows remote assembly and individual operation, presents a small target in a threat environment, minimizes the number of optical structures needed for concentration of incident light, and is therefore lighter in weight, simpler in design and more economical in structure and operation than previously known systems.

The invention, as hereinabove described, therefore provides a novel photovoltaic system for converting sunlight to electrical power. It is understood that modifications to the invention as described may be made, as might occur to one with skill in the field of this invention, within the scope of the appended claims. Therefore, all embodiments contemplated hereunder which achieve the objects of the invention have not been shown in complete detail. Other embodiments may be developed without departing from the spirit of the invention or from the scope of the appended claims.

I claim:

1. A photovoltaic solar cell system comprising:
   (a) a hollow light tube of substantially optically transparent material, said tube having preselected length and first and second ends and including four substantially identical walls of preselected width having flat inner intersecting surfaces defining along a central axis a passageway of generally square cross section extending between said ends, said walls having on the outer surfaces thereof a plurality of triangularly shaped grooves extending along the length of said tube, said grooves defining a plurality of ridges having triangular cross section and extending along the length of said tube, said triangular cross section of each ridge having an apex angle of 90° and the surfaces of said ridges along the length of said tube defining an angle of 45° with said inner surfaces of said walls;
   (b) optical means operatively connected to said first end of said tube for directing light into said tube at said first end;
   (c) a plurality of solar cells each having a front photoactive surface and a back surface disposed in a rectangular array corresponding in size to the preselected width of said walls and length of said tube, said cells disposed on the outer surfaces of said walls of said tube with said front photoactive surfaces of said cells facing inwardly of said tube.

2. The system as recited in claim 1 wherein said cells are mounted on a substrate in said rectangular array.

3. The system as recited in claim 1 further comprising a cushioning layer between said front photoactive surfaces of said cells and said ridges on the outer surfaces of said tube.

4. The system as recited in claim 1 wherein said optical means includes a collimating lens at said first end of said tube and a parabolic reflector operatively connected to said collimating lens for directing light along said axis into said tube.

5. The system as recited in claim 1 wherein said optical means includes a collimating lens at said first end of said tube and a focusing lens optically aligned with said collimating lens for directing light along said axis into said tube.

6. The system as recited in claim 1 further comprising an end wall closing said second end of said tube.

7. The system as recited in claim 6 further comprising a mirrored surface on the inwardly facing surface of said end wall.

8. The system as recited in claim 6 wherein said tube, optical means and end wall are hermetically sealed and said passageway is evacuated.

9. The system as recited in claim 8 wherein said cells are hermetically sealed to said outer surfaces of said tube and the space defined between said ridges and said front photoactive surfaces of said cells is evacuated.

10. The system as recited in claim 6 wherein said tube, optical means and end wall are hermetically sealed and said passageway is filled with inert gas.

11. The system as recited in claim 10 wherein said cells are hermetically sealed to said outer surfaces of said tube and the space defined between said ridges and said front photoactive surfaces of said cells is filled with inert gas.

* * * * *